United States Patent [19]

Countryman, Jr. et al.

[11] 4,380,866
[45] Apr. 26, 1983

[54] METHOD OF PROGRAMMING ROM BY OFFSET MASKING OF SELECTED GATES

[75] Inventors: Roger S. Countryman, Jr.; Paul T. Lin, both of Austin, Tex.

[73] Assignee: Motorola, Inc., Schaumburg, Ill.

[21] Appl. No.: 260,493

[22] Filed: May 4, 1981

[51] Int. Cl.³ .................. H01L 21/263; G11C 11/40; H01L 7/44
[52] U.S. Cl. .................................... 29/577 C; 29/571; 29/576 B; 148/1.5; 148/187; 357/24; 357/91
[58] Field of Search ................. 29/571, 577 C, 576 B; 148/1.5, 187; 357/24, 91

[56] References Cited

U.S. PATENT DOCUMENTS

| | | | |
|---|---|---|---|
| 4,104,754 | 8/1978 | Klein | 29/571 |
| 4,221,044 | 9/1980 | Godejan, Jr. | 29/571 |
| 4,230,504 | 10/1980 | Kuo | 148/1.5 |
| 4,258,465 | 3/1981 | Yasui et al. | 29/571 |
| 4,282,646 | 8/1981 | Fortino et al. | 29/571 |
| 4,290,184 | 9/1981 | Kuo | 29/571 |
| 4,294,001 | 10/1981 | Kuo | 29/571 |
| 4,305,200 | 12/1981 | Fu et al. | 29/571 |

OTHER PUBLICATIONS

Abbas et al., IBM-TDB, 20 (1977) 1376.
Bassous et al., IBM-TDB, 22 (1980) 5146.

Primary Examiner—Upendra Roy
Attorney, Agent, or Firm—John A. Fisher

[57] ABSTRACT

A process is disclosed for fabricating a MOS ROM which allows programming of the ROM late in the process sequence. A conventional silicon gate process is used to fabricate the devices up through the step of patterning the polycrystalline silicon gate electrode. Selected devices in the array are then programmed to an off-state by fabricatng those devices with either the source or drain region offset from the gate electrode. This is accomplished by a programming mask which, together with the gate electrode, provides selective location of the source or drain regions. Devices having an offset source or drain are off-state devices, while those having a normal source and drain function conventionally and conduct when a read voltage is applied.

8 Claims, 11 Drawing Figures

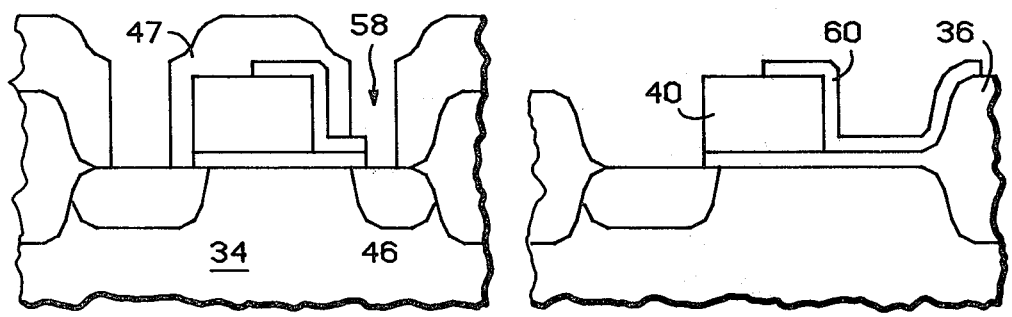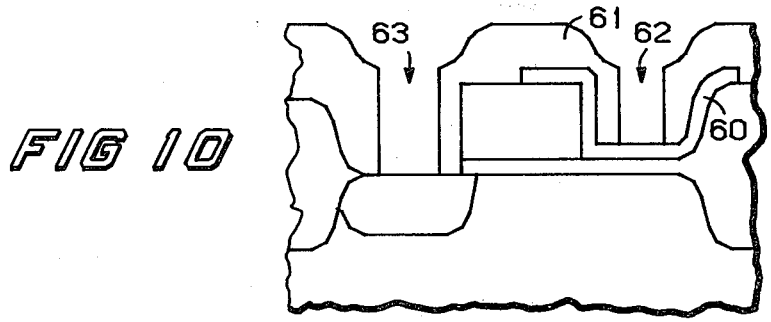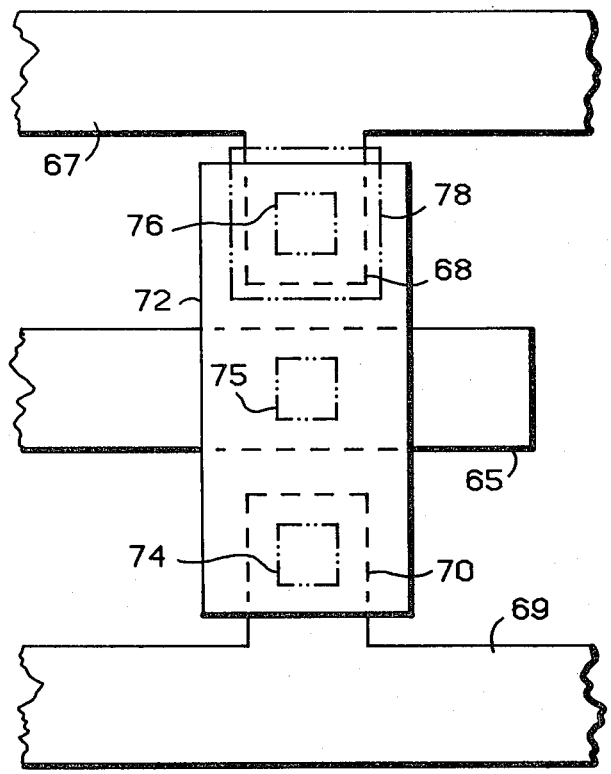

METHOD OF PROGRAMMING ROM BY OFFSET MASKING OF SELECTED GATES

BACKGROUND OF THE INVENTION

This invention relates to a MOS ROM and more particularly to a structure and method of programming a MOS ROM.

One device in the hierarchy of semiconductor memories is the Metal-Oxide-Semiconductor Read Only Memory or MOS ROM. The device is a fixed memory programmed during fabrication and is typically fabricated and programmed to incorporate a particular user program.

In the present technology, most ROMs are programmed at the active area patterning step. By this method no active area is provided for devices in those locations designed to incorporate an off-state. Instead of providing an active area as for a normal device, thick field oxide is grown in that location. Active area programming reliably provides a ROM having the desired programming, but has the serious drawback that the active area programming is done at a process step very early in the total fabrication process. It is preferable, however, to do the programming at as late a step in the process as is possible.

Because a number of ROM devices are identical except for the information stored at the programming step, unprogrammed devices can be processed up to the programming step and stockpiled while waiting for orders for particular custom programs. Upon receipt of a customer order the partially completed devices can be programmed, quickly completed, and shipped to the customer. The stockpiling of partially completed devices permits the more rapid filling of customer orders. The later in the process the programming can be accomplished, the shorter the turn-around time after receipt of the custom program order.

Programming near the end of the device fabrication process can be achieved, for example, by selective ion implantation through the gate electrode to alter selected device threshold voltages, by leaving out selected contact openings and thus not providing electrical contact to selected devices, or straightforwardly by changing the metal pattern so as to bypass selected devices. There are disadvantages, however, to each of these programming methods. Implanting through the gate to control the threshold, for example, requires very high energy implants to implant through both the gate oxide and the thick polycrystalline silicon gate electrode material. Proper control of threshold voltage is difficult to achieve: too high an implant dose can adversely affect the breakdown voltage of the adjacent junctions; a thicker than expected gate electrode blocks too much of the implant and results in an insufficient change in the device threshold voltage. Leaving out selected contact openings requires more layout area since the memory must be designed with each memory cell having its own contact opening; contacts cannot be shared between cells. Similarly, selective metallization takes extra space on the chip as regular metal runs must be interrupted to route around and avoid the unselected contacts.

Accordingly a need existed to develop a MOS ROM structure and method for programming which would overcome the problems of the prior art to provide a MOS ROM which can be programmed late in the device fabrication process.

It is therefore an object of this invention to provide an improved MOS ROM structure.

It is a further object of this invention to provide an improved method for programming a MOS ROM.

It is a still further object of this invention to provide an improved process for programming a MOS ROM which is applicable late in the fabrication sequence.

SUMMARY OF THE INVENTION

The foregoing and other objects and advantages of the invention are achieved through a process in which selected source or drain regions are displaced from the corresponding gate electrodes to form off-state devices. In one embodiment of the invention an array of silicon gate MOS transistors is fabricated. The conventional fabrication sequence is followed through and including the patterning of the polycrystalline silicon gate electrode. In accordance with the invention, a programming mask is then selectively applied which overlaps selected gate electrodes and the area adjacent the gate electrodes which would otherwise be used to form source or drain regions. Dopant impurities are introduced to form source and drain regions at locations not covered by the programming mask. Normal devices are thus formed at locations in the array where there is no programming mask; off-state devices are formed at those locations in the array where the programming mask prevents the formation of a source or drain region adjacent a gate electrode.

BRIEF DESCRIPTION OF THE DRAWINGS

FIGS. 6–8 illustrate an alternate embodiment of the invention;

FIGS. 9 and 10 illustrate a further alternate embodiment of the invention; and

FIG. 11 illustrates a still further programming alternative in accordance with the invention.

DETAILED DESCRIPTION OF PREFERRED EMBODIMENTS

Figure 1:
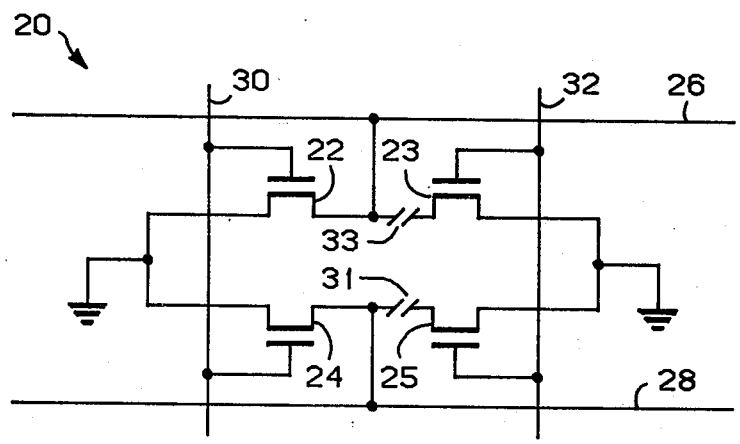
FIG. 1 illustrates a portion of a MOS ROM array.

FIG. 1 illustrates schematically a portion of a MOS ROM array 20. Illustrated in this portion of array 20 are four MOS transistors. The drains of transistors 22 and 23 are connected to bit line 26. The drains of transistors 24 and 25 are connected to bit line 28. The gates of transistors 22 and 24 are connected to a common line 30 while the gates of transistors 23 and 25 are connected to a common line 32. Transistors 22 and 24 are conventional MOS transistors which enter a conducting "on" state upon the application of a sufficient potential to common line 30. Transistors 23 and 25 are "off" state devices illustrated schematically by the break 31, 33 in the drain region connection. Because of the interrupted connection the devices are not rendered conductive by any potential applied to common gate connection 32. The portion of the array illustrated is thus programmed to have two conducting (on-state) and two non-conducting (off-state) devices.

In accordance with the invention, array 20 is fabricated by the process sequence illustrated in FIGS. 2–5. The figures illustrate in cross-section the fabrication of two devices such as conventional transistor 24 and off-state transistor 25.

Figure 2:
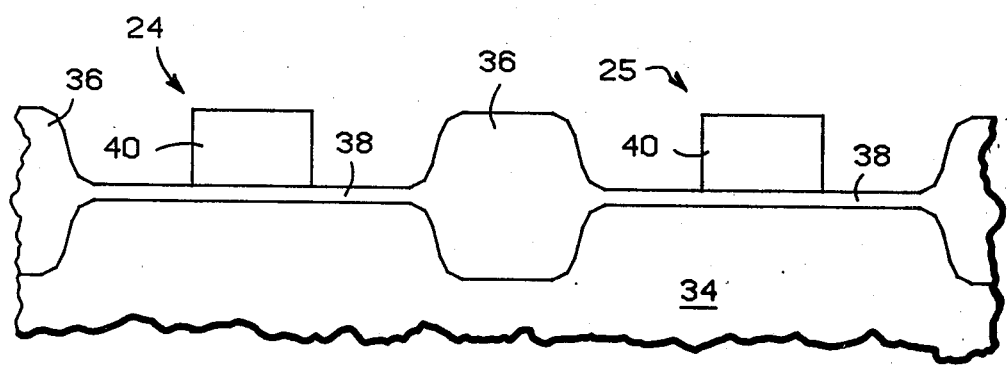
FIGS. 2–5 illustrate process steps in accordance with the invention for fabricating a MOS ROM array.

FIG. 2 illustrates a portion of semiconductor wafer 34 in which the array 20 is fabricated. The wafer is p-type single crystal silicon. At the surface of the wafer thick 36 and thin 38 regions of silicon dioxide are formed. The thick field oxide regions provide isolation between the individual devices. The thin oxide forms the gate oxide of the finished devices. Overlying the thin oxide is polycrystalline silicon patterned to form the gate electrodes 40 of the transistors. The processing steps required to achieve this structure are well known in the art of MOS integrated circuit fabrication and therefore need not be further described here.

The structure as illustrated in FIG. 2 is perfectly generalized with no particular program yet having been implemented. Wafers processed to this point of completion can thus be stockpiled awaiting the particular programming requirements of the ROM customer. Upon receipt of an order the time required to complete the devices with the incorporation of a particular program is greatly reduced because front end processing has already been completed.

Figure 3:
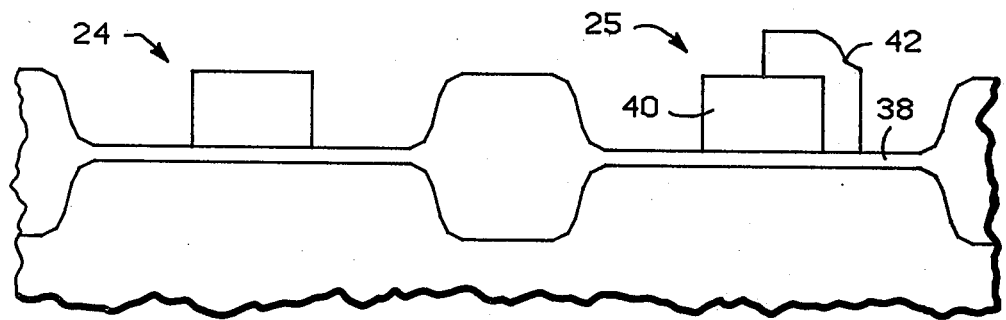

FIG. 3 illustrates one embodiment in accordance with the invention by which the previously formed structure is selectively programmed to implement the desired ROM array. A masking material is applied over the surface of the wafer and selectively patterned to leave the programming mask 42 over selected off-state devices such as device 25. Masking material 42 is, for example, a layer of conventional photoresist. The masking material is located on the polycrystalline silicon 40 and a portion of the adjacent thin oxide 38. The exact alignment of masking material 42 is non-critical, having a considerable sideways alignment tolerance. To be effective, the mask need only cover that portion of thin oxide immediately adjacent the gate electrode. The mask should not, however, overlap excessively onto gate electrode 40 as the mask will also interfere with the subsequent doping of the polycrystalline gate.

Figure 4:
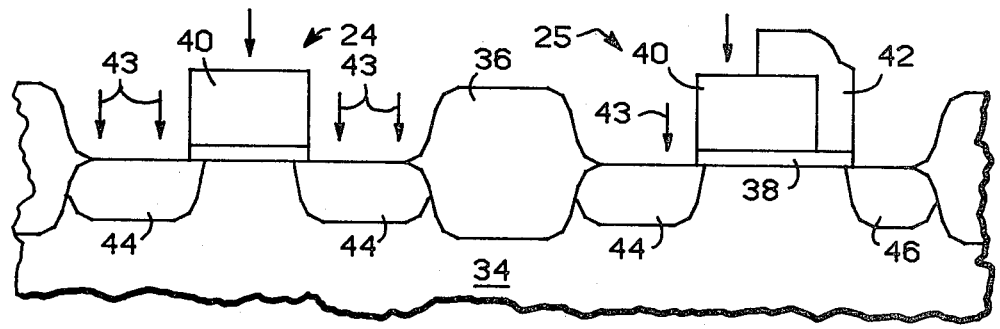

As illustrated in FIG. 4, the masking material 42, in combination with the thick oxide and the exposed polycrystalline silicon is used as an etch mask to selectively remove the exposed portions of thin oxide 38. In one embodiment of the invention, n-type ions are then implanted into the now exposed surface of the silicon wafer 34 as indicated by the arrows 43. Masking material 42, underlying thin oxide 38, thick oxide 36 and exposed polycrystalline silicon 40 provide an ion implant mask and prevent the doping of wafer 34 except in selected regions. The n-type implant forms source and drain regions 44 and a detached drain region 46 in addition to doping gate electrode 40. Alternatively, the ions can first be implanted through the thin gate oxide using photoresist 42 as an implant mask followed by the subsequent removal of the oxide using the photoresist as an etch mask. In a still further alternative, masking material 42 can be removed after patterning thin oxide 38. The source and drain regions including the detached drain region 46 can then be formed by conventional thermal diffusion using the thin oxide as a diffusion mask. The diffusion must, of course, be of limited extent so that the thin gate oxide provides an adequate diffusion mask; but in this alternative, overlap of mask 42 does not affect the doping of gate electrode 40.

Figure 5:
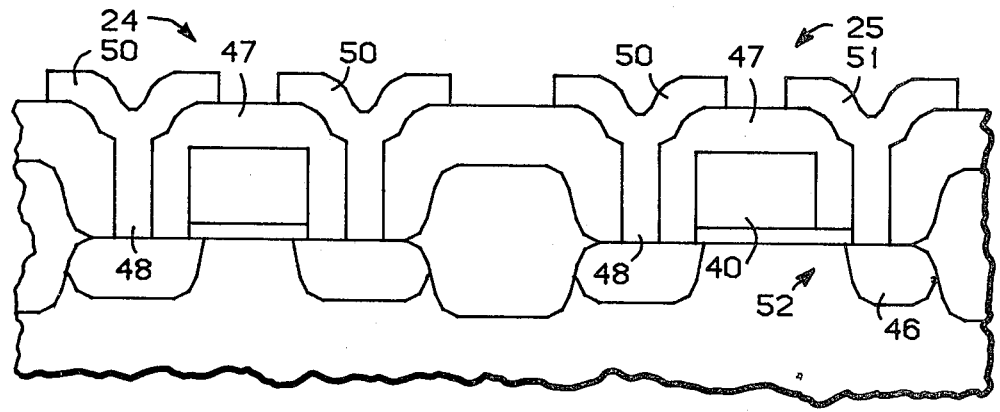

The structure is completed in conventional manner by forming an insulating layer 47 by thermal oxidation or by deposition over the diffused source and drain regions and over the gate electrode. Contact openings 48 are etched through this insulating layer to allow electrical contact to the device regions as shown in FIG. 5. A layer of aluminum, aluminum alloy, or other metal is deposited over the surface of the device and patterned to form device contacts 50, 51, as well as device interconnections (not shown). The metal segments 50 make electrical contact to source and drain regions adjacent the gate electrodes. Metal segment 51 contacts the detached drain 46 of off-state device 25. Device 25 is "off" and remains "off" because the surface region 52 is uncontrolled by gate electrode 40 and remains uninverted regardless of the potential on gate 40. The non-conducting region 52 is thus in series between the device channel and the detached drain. Although not illustrated, the diffused regions between devices can be merged and a single contact shared between devices.

Figure 6:
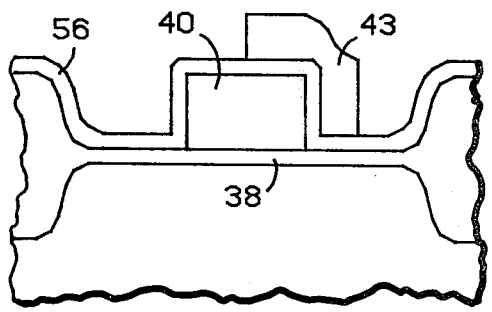
Figure 7:
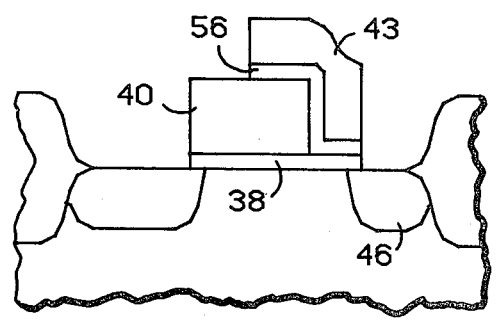

FIGS. 6–8 illustrate a further embodiment of the invention. Only the off-state device is illustrated. Starting with the structure as in FIG. 2, a layer of silicon nitride 56 is deposited over the wafer covering the thin oxide and polycrystalline gate electrode. A layer of photoresist 43 is applied over the nitride layer and selectively patterned on the off-state devices as illustrated in FIG. 6.

The photoresist is used as an etch mask to pattern the underlying nitride as illustrated in FIG. 7. Any of the aforementioned alternatives can now be utilized for the formation of the detached drain region 46. The programming mask comprises either the nitride layer plus underlying oxide or the composite structure of photoresist, nitride and oxide.

The silicon nitride provides a dual advantage in this embodiment. The nitride is a better diffusion mask than is the thin oxide alone. Additionally, as illustrated in FIG. 8, the silicon nitride performs a self-aligning feature for the formation of a contact to the detached drain region. After the formation of an insulating layer 47, contact openings such as indicated at 58 are etched to allow electrical contact to the detached drain region 46. No critical alignment is required between the opening 58 and diffused region 46. If the opening is shifted laterally the nitride acts as an etch stop and prevents exposure of the undiffused portion of the p-type substrate 34. Exposure of the substrate will cause a short and therefore a non-functioning array when metal is subsequently deposited in the opening 58.

A still further embodiment of the invention is illustrated in FIGS. 9 and 10. This embodiment can be implemented with any of the aforementioned processing alternatives, but is illustrated using a nitride approach. A silicon nitride layer 60 is patterned on selected off-state devices to extend from the gate electrode 40 to the thick oxide 36. The nitride thus covers all of the thin oxide region on the drain side of the device. During subsequent ion implantation or diffusion a source region is formed adjacent the gate electrode, but no drain region is formed. An oxide layer 61 is formed covering the surface of the device and contact openings 62, 63 are etched to allow electrical contact to the diffused device regions. As illustrated in FIG. 10, the nitride layer 60 forms an etch stop and prevents etching of the contact opening 62 to the surface of the silicon wafer. Thus neither a drain region nor a contact is formed on selected devices.

A further benefit achieved through practice of the invention is illustrated in FIG. 11. This advantage is achieved simultaneously with the above disclosed programming without further processing steps. As illustrated in FIG. 11 which depicts a composite masking on the top surface of the device, discretionary wiring can be used to selectively connect diffused line 65 with either one of diffused lines 67 and 69. Provision is made in the active area programming mask for the diffused regions including the contact areas 68 and 70. The contact opening mask provides for contact openings 74, 75, 76 through which contact can be made to diffused regions 69, 65, 67, respectively. The metal mask defines a metal portion 72 which overlies the contact openings and provides shorting between the selected diffused regions.

Selection occurs simultaneously with the ROM array programming. At the same time the programming mask such as 42 is formed, an additional mask 78 is formed to determine which of the selected interconnects is to be completed. As illustrated, the interconnect is to be completed between diffused regions 65 and 69 with no interconnection between diffused regions 65 and 67. In the same manner that programming mask 42 prevents the complete formation of a source or drain, so also does mask 78 prevent the complete formation of the contact area 68. No diffusion takes place under that region masked by mask 78 because the thin gate oxide was not removed from that area. When using this process care must be exercised in etching the contact openings 74, 75, 76 so that the unselected contact opening, 76 in this example, is not etched through the underlying gate oxide. Mask 78 thus prevents the diffusion of the contact region 68 and also prevents the opening of contact opening 76.

Thus, it is apparent that there has been provided, in accordance with the invention, an improved process for programming ROM's which allows the programming to be accomplished late in the device processing. While the invention has been described in conjunction with specific embodiments thereof, it is not intended that the invention or its use be so limited. The invention can be used, for example, for the fabrication of other than n-channel ROM's and can employ alternate masking materials, insulators, insulator forming techniques, and alternate forms of junction formation. Other variations and modifications will, of course, be apparent to those skilled in the art in light of the foregoing description. Accordingly, it is intended to embrace all such variations and modifications as fall within the scope of the invention.

We claim:

1. A process for making a MOS ROM array having a plurality of devices programmed to first or second memory states which comprises the steps of: providing a silicon wafer of first conductivity type having a surface; selectively forming a field oxide on said surface to surround at said surface a plurality of active device locations; forming a thin gate oxide on said surface in said active device locations; selectively forming polycrystalline silicon gate electrodes overlying portions of said thin gate oxide; forming a programming mask at selected ones of said active device locations, at said selected locations said mask overlying a portion of said polycrystalline silicon gate electrode and a portion of said thin gate oxide adjacent but not overlaid by said electrode; introducing dopant to said wafer to form source and drain regions of second conductivity type at locations not overlaid by said programming mask, programming devices to said first memory state in locations where source and drain regions are formed adjacent a gate electrode and programming devices to said second memory state in locations where one of said source and drain regions is not formed adjacent said gate electrode.

2. The process of claim 1 wherein said programming mask comprises photoresist.

3. The process of claim 1 wherein said programming mask comprises silicon nitride.

4. The process of claim 1 wherein said step of introducing dopant comprises ion implantation.

5. A process for programming to an off-state a selected MOS transistor in an array, said transistor formed at a surface of a semiconductor wafer and having a gate electrode, the process comprising the steps of: forming a programming mask covering a portion of said surface of said semiconductor wafer adjacent said gate electrode; and diffusing said wafer with a conductivity determining impurity to form source and drain regions in said wafer, said programming mask preventing diffusion formation of one of said regions adjacent said gate electrode.

6. A process for programming an integrated circuit including an array of MOS transistors and further including a plurality of diffused interconnections, the process comprising: providing a semiconductor wafer of first conductivity type having a surface; providing on said surface active regions for forming said transistors and interconnections; forming an insulator overlying said active regions; forming patterned electrodes overlying said insulator; forming a programming mask overlying a portion of said insulator adjacent selected ones of said patterned electrodes; and introducing dopant of second conductivity determining type to said semiconductor wafer to form said interconnections and source and drain regions of said transistors at locations not overlaid by said programming mask, programming devices to a first memory state in locations where source and drain regions are formed adjacent a gate electrode and programming devices to a second memory state in locations where one of said source and drain regions is not formed adjacent said gate electrode.

7. The process of claim 6 wherein said programming mask further is formed overlying selected portions of said active regions for said interconnections, said mask preventing said introducing of dopant in portions of said interconnections.

8. The process of claim 7 wherein said programming mask further prevents the forming of contact openings to selected portions of said interconnection.

* * * * *